United States Patent
Hayashi et al.

(10) Patent No.: US 7,863,615 B2
(45) Date of Patent: Jan. 4, 2011

(54) DISPLAY UNIT AND METHOD OF MANUFACTURING THE SAME

(75) Inventors: Naoki Hayashi, Kanagawa (JP); Atsuya Makita, Tokyo (JP); Yasunobu Hiromasu, Kanagawa (JP)

(73) Assignee: Sony Corporation, Tokyo (JP)

( * ) Notice: Subject to any disclaimer, the term of this patent is extended or adjusted under 35 U.S.C. 154(b) by 84 days.

(21) Appl. No.: 12/253,477

(22) Filed: Oct. 17, 2008

(65) Prior Publication Data

US 2009/0101905 A1 Apr. 23, 2009

(30) Foreign Application Priority Data

Oct. 19, 2007 (JP) ............... 2007-272754

(51) Int. Cl.
*H01L 27/04* (2006.01)
*H01L 21/70* (2006.01)

(52) U.S. Cl. .............. 257/59; 257/776; 257/E27.01; 257/E21.533; 257/E23.143; 257/E23.17; 438/29

(58) Field of Classification Search .......... 257/59, 257/E27.01, E21.533, 776, E23.143, E23.17; 438/29
See application file for complete search history.

(56) References Cited

U.S. PATENT DOCUMENTS

| 5,539,551 A * | 7/1996 | Nomoto et al. ........ 349/42 |
| 6,900,464 B2 * | 5/2005 | Doi et al. ........... 257/72 |
| 2006/0028606 A1 * | 2/2006 | Takeguchi et al. ..... 349/149 |
| 2008/0062344 A1 * | 3/2008 | Yoshimoto ........... 349/43 |

FOREIGN PATENT DOCUMENTS

| JP | 07-086230 | | 3/1995 |
| JP | 2000-216398 A | | 8/2000 |
| JP | 2000-252473 A | | 9/2000 |
| JP | 2002-090774 | | 3/2002 |
| JP | 2003-045966 | * | 2/2003 |
| JP | 2003-186421 A | | 7/2003 |

(Continued)

OTHER PUBLICATIONS

Japanese Patent Office, Office Action issued in Patent Application JP 2007-272754, on Aug. 4, 2009.

(Continued)

*Primary Examiner*—Ngan Ngo
*Assistant Examiner*—Benjamin Tzu-Hung Liu
(74) *Attorney, Agent, or Firm*—SNR Denton US LLP

(57) ABSTRACT

A display unit includes, on an insulating substrate, a plurality of wirings formed to extend in different directions, a thin-film transistor, and a display element. At least one of the plurality of wirings is a divided wiring having a crossing portion formed at an intersection with the other of the plurality of wirings, and a main portion which is formed in a layer same as the other of the plurality of wirings with an insulating film in between and which is electrically connected to the crossing portion via an conductive connection provided in the insulating film. At least one of the main portion and the crossing portion includes a first layer and a second layer stacked in order from the insulating substrate side, the second layer being in direct contact with the first layer and made of a material of a higher melting point than the first layer.

14 Claims, 16 Drawing Sheets

FOREIGN PATENT DOCUMENTS

| | | |
|---|---|---|
| JP | 2005-115297 A | 4/2005 |
| JP | 2006-086514 | 3/2006 |
| JP | 2006-323333 A | 11/2006 |
| JP | 2007-123906 | 5/2007 |
| JP | 2007-139954 A | 6/2007 |
| WO | 03/036707 A1 | 5/2003 |

OTHER PUBLICATIONS

Japanese Patent Office Action corresponding to Japanese Serial No. 2007-272754 dated Dec. 8, 2009.

* cited by examiner

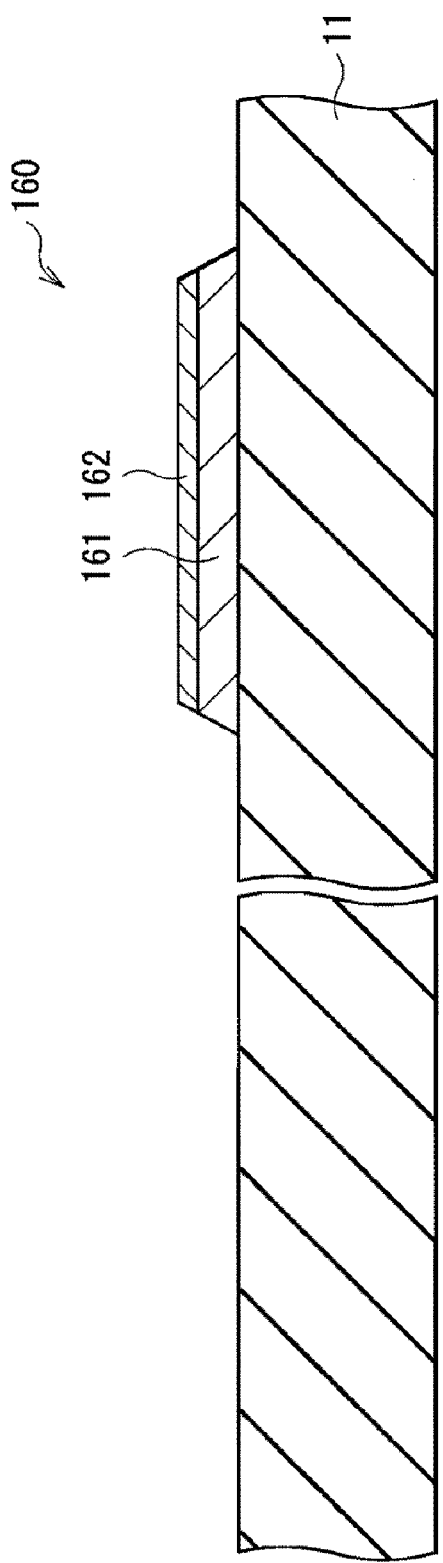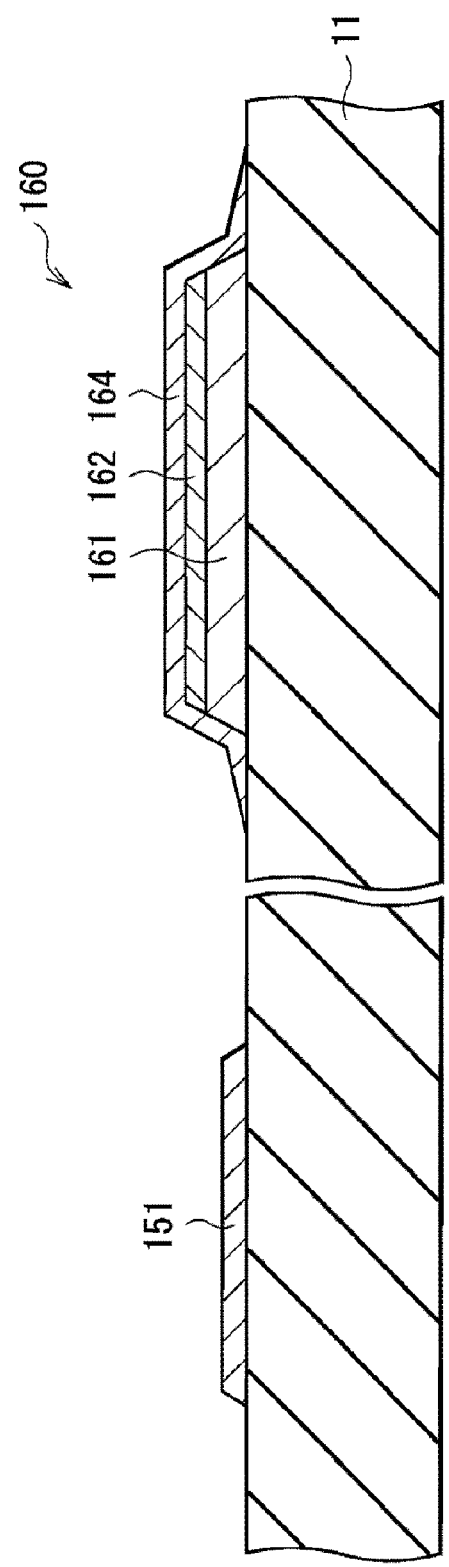

DISPLAY UNIT AND METHOD OF MANUFACTURING THE SAME

CROSS REFERENCE TO RELATED APPLICATIONS

The present invention contains subject matter related to Japanese Patent Application JP2007-272754 filed in the Japanese Patent Office on Oct. 19, 2007, the entire contents of which being incorporated herein by reference.

BACKGROUND OF THE INVENTION

1. Field of the Invention

The present invention relates to a display unit which is suitably applied to an organic electro luminescence display or liquid crystal display for example, and also relates to a method of manufacturing the same.

2. Description of the Related Art

In recent years, development of next-generation displays is active due to an increasing demand for space-saving, high luminance, low power consumption and so on. In such situation, the organic electro luminescence display (organic EL display) using an organic light emitting element attracts attention as those satisfying such demands. In the organic electro luminescence display, wide viewing angle is available due to its light-emitting feature. What is more, since no backlight is necessary, it is possible to realize power saving and high responsiveness and further to reduce thickness in dimension. In addition, the organic electro luminescence display attracts more attention due to its flexibility when using a plastic plate as a substrate to utilize the flexible nature inherent to organic luminescent materials.

As for a drive system of the organic electro luminescence display, the active matrix system, in which a thin film transistor (TFT) is used as its drive element, recognizes advantages in response time and resolution compared with the passive matrix system of related art, thereby considered to be much suitable for the organic electro luminescence display having features as mentioned above.

As for the thin film transistor used in the active matrix organic electro luminescence display, at least a switching transistor for controlling the tone of a pixel and a drive transistor for controlling light emission of the organic light emitting element are necessary. A capacitor is connected to a gate electrode of the drive transistor to hold an electric charge in accordance with a display signal.

Due to its enlarged display size and advanced fineness, such active matrix organic light emitting element suffers from disadvantages of longer and finer gate wiring, source signal line and current supply line. However, the resistance of wiring increases in proportion to the length and in inverse proportion to the cross-section area. Such increase in resistance results in a distortion of signal waveform and transmission delay of signals, thereby leading to unevenness and degradation of image quality.

In order to lower the wiring resistance, usage of a low resistance material such as aluminum (Al) may be useful. However, such low resistance material as aluminum (Al) does not have enough thermal resistance. Since it is inevitable in the manufacturing process of a thin film transistor, which includes a gate insulating film for example, to raise the temperature of a substrate to 300° C. or more, independent usage of aluminum (Al) may cause a hillock due to the thermal stress, thereby deterioration of insulation quality is observed in interlayer insulating films.

For example, disclosure by Japanese Patent Publication No. 2003-45966 shows that a scanning line 3a and a main portion 61a of a data line 6a are made of a low resistance metal such as aluminum or an aluminum alloy. Here, at the wiring intersection, a relay portion 62a of the data line 6a, which is made of a refractory metal, is disposed under the scanning line 3a and a capacitance line 3b. Such divided wiring enables to suppress the generation of hillock at the intersection even when the relay portion is exposed to high temperature in the manufacturing process of a thin film transistor.

SUMMARY OF THE INVENTION

However, in the above-mentioned disclosure, since the relay portion 62a is not made of a low resistance metal, wiring resistance increases more than a little so that there is a possibility of signal transmission delay for a larger screen.

Incidentally, disclosure by Japanese Patent Publication No. 07-86230 shows that after oxidizing the surface of an aluminum (Al) wiring under an oxygen atmosphere, it is covered with a high-melting material. In this case, the oxide film formed between the aluminum (Al) wiring and the high-melting material has a resistance component characteristic. In the case of normal wiring other than the divided wiring, since the aluminum (Al) wiring and the high-melting material are connected at several points through a pinhole or the like, the resistance component does not become an issue. However, when the disclosure is applied to the above-mentioned divided wiring, there appears the resistance component in each relay portion, thereby the low resistance feature of the lower layer is scarcely used efficiently as if it were solely configured by the upper refractory metal. As a result, it is difficult to sufficiently reduce the wiring resistance, which results in a distortion of signal waveform and transmission delay of signals, thereby leading to unevenness and degradation of image quality.

In the manufacturing process of a thin film transistor, sometimes laser irradiation is applied to the whole surface of a substrate for the purpose of silicon crystallization. In that case, low resistance materials such as aluminum (Al) may not be used even when it is covered with a refractory metal because there may be a shortcoming of thermal resistance or diffusion in high temperatures.

In view of the above-mentioned drawbacks, it is desirable to provide a display capable of reducing the wiring resistance of a divided wiring to improve the image quality, and a method of manufacturing the same.

According to an embodiment of the present invention, there is provided a display unit including, on an insulating substrate, a plurality of wirings formed to extend in different directions, a thin-film transistor and a display element. Among the plurality of wirings, at least one of them is a divided wiring having a crossing portion formed at an intersection with the other of the plurality of wirings and a main portion which is formed in a layer same as the other of the plurality of wirings with an insulating film in between and which is electrically connected to the crossing portion via an conductive connection provided in the insulating film. Among the main portion and the crossing portion, at least one of them includes a first layer and a second layer stacked in order from the insulating substrate side. The second layer is in direct contact with the first layer and made of a material of a higher melting point than the first layer.

According to an embodiment of the present invention, there is provided a method of manufacturing a display unit which is constituted from steps of forming, on an insulating substrate, a plurality of wirings including a source signal line and a gate wiring, a thin film transistor and a display element. The step of forming the plurality of wiring includes the steps of forming a crossing portion of the source signal line at an intersection with the gate wiring, forming an insulating film on the insulating substrate on which the crossing portion is formed, and forming a main portion of the source signal line and the gate wiring on the insulating film and providing a conductive connection in the insulating film for electrically connecting the main portion and the crossing portion. In the step of forming the crossing portion of the source signal line, a first layer and a second layer made of a material of a higher melting point than the first layer are continuously formed in order from the insulating substrate side.

In the display unit of the embodiment of the present invention, since the first layer and the second layer made of a material of a higher melting point than the first layer are in direct contact with each other, the resistance of the crossing portion is reduced. This allows the divided wiring to reduce its wiring resistance, thereby suppressing a distortion of signal waveform and transmission delay of signals, etc., so as to improve the image quality.

According to a display unit of the embodiment of the present invention, since a first layer and a second layer made of a material of a higher melting point than the first layer are in direct contact with each other, the resistance of a crossing portion is lowered. This allows a divided wiring to reduce wiring resistance, thereby suppressing a distortion of signal waveform and transmission delay of signals, etc., to improve the image quality. According to a method of manufacturing a display unit of the embodiment of the present invention, since the first layer and the second layer are formed continuously, formation of the display unit of the embodiment of the present invention becomes easier.

Other and further objects, features and advantages of the invention will appear more fully from the following description.

BRIEF DESCRIPTION OF THE DRAWINGS

FIGS. 8A and 8B are sectional views showing step of manufacturing the display unit of FIG. 1 in the processing sequence.

DESCRIPTION OF THE PREFERRED EMBODIMENTS

Embodiments of the present invention will be described in detail hereinbelow with reference to the drawings.

First Embodiment

Figure 1:
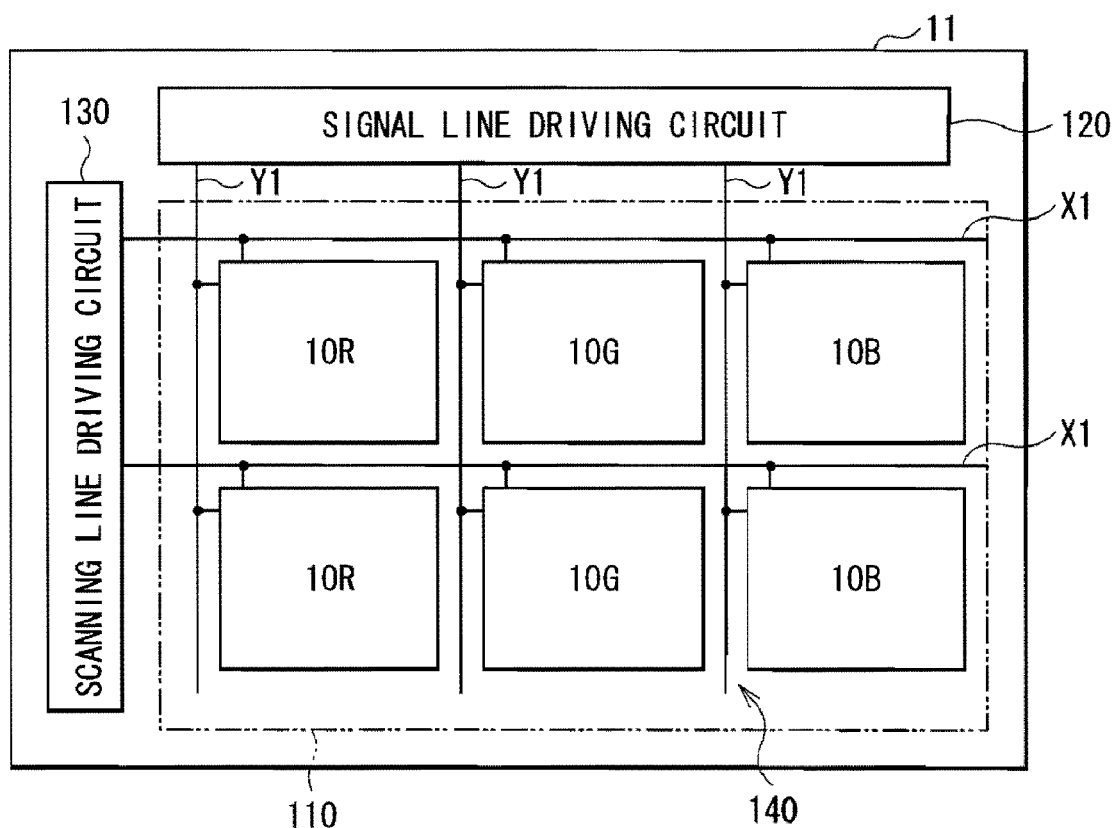
FIG. 1 shows a configuration of a display unit according to a first embodiment of the present invention.

FIG. 1 shows a configuration of display unit according to a first embodiment of the present invention. The display unit is used as an ultrathin color organic EL display and so on, and is typically configured in such a manner that a display region 110, which is constituted from an after-mentioned plurality of organic light emitting elements 10R, 10G and 10B arrayed in matrix, is disposed on an insulating substrate 11 made of a glass or a plastic, while a signal line driving circuit 120 and a scanning line driving circuit 130, which are drivers for video display, are formed around the display region 110.

A pixel driving circuit 140 is formed in the display region 110. A plurality of gate wirings X1 are arranged in rows and a plurality of source signal lines Y1 are arranged in columns on the pixel driving circuit 140. Each intersection between the respective gate wirings X1 and the source signal lines Y1 corresponds to any one of the organic light emitting elements 10R, 10G, and 10B (subpixels) one to one. Each of the source signal lines Y1 is connected to the signal line driving circuit 120 so that an image signal is supplied from the signal line driving circuit 120 to an after-mentioned source electrode of a write transistor Tr2 via the source signal lines Y1. Each of the gate wirings X1 is connected to the scanning line driving circuit 130 so that a scan signal is sequentially supplied from the scanning line driving circuit 130 to a gate electrode of the write transistor Tr2 via the gate wirings X1.

Figure 2:
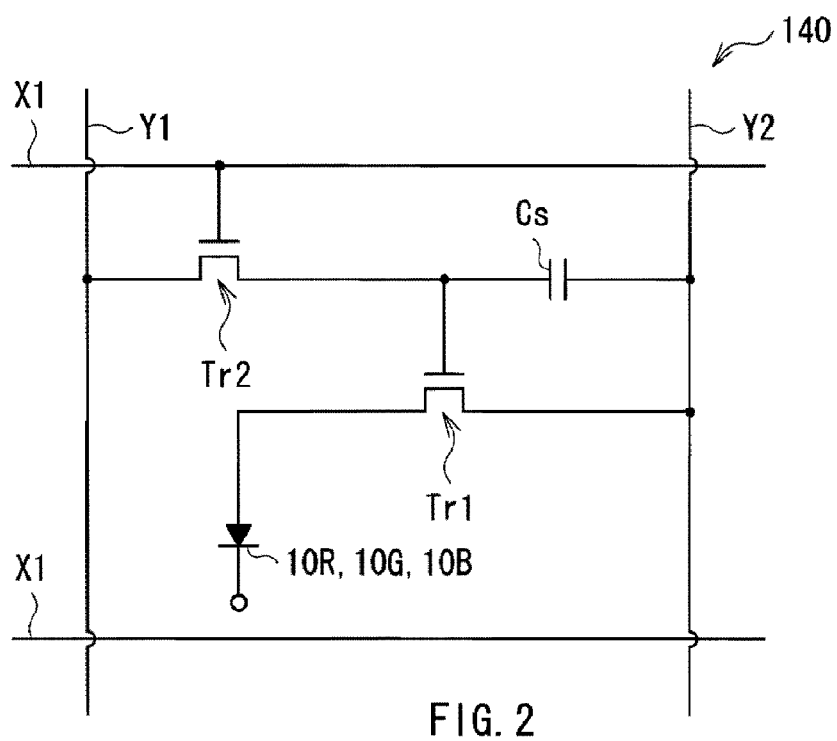
FIG. 2 is a representative circuit schematic showing an example of a pixel driving circuit appearing in FIG. 1.

FIG. 2 is an example of the pixel driving circuit 140. The pixel driving circuit 140, which is formed in a lower layer of an after-mentioned first electrode 13, is an active driving circuit including a drive transistor Tr1, the write transistor Tr2, a capacitor Cs, and the organic light emitting element 10R (or 10G, 10B).

The gate electrode of the write transistor Tr2 is connected to the gate wiring X1, the source electrode thereof is connected to the source signal line Y1, and the drain electrode thereof is connected to the gate electrode of the drive transistor Tr1 and one end of the capacitor Cs. The source electrode of the drive transistor Tr1 is connected to a current supply line Y2 which extends in a lengthwise direction and the drain electrode thereof is connected to the organic light emitting element 10R (or 10G, 10B). The other end of the capacitor Cs is connected to the current supply line Y2.

Figure 3:
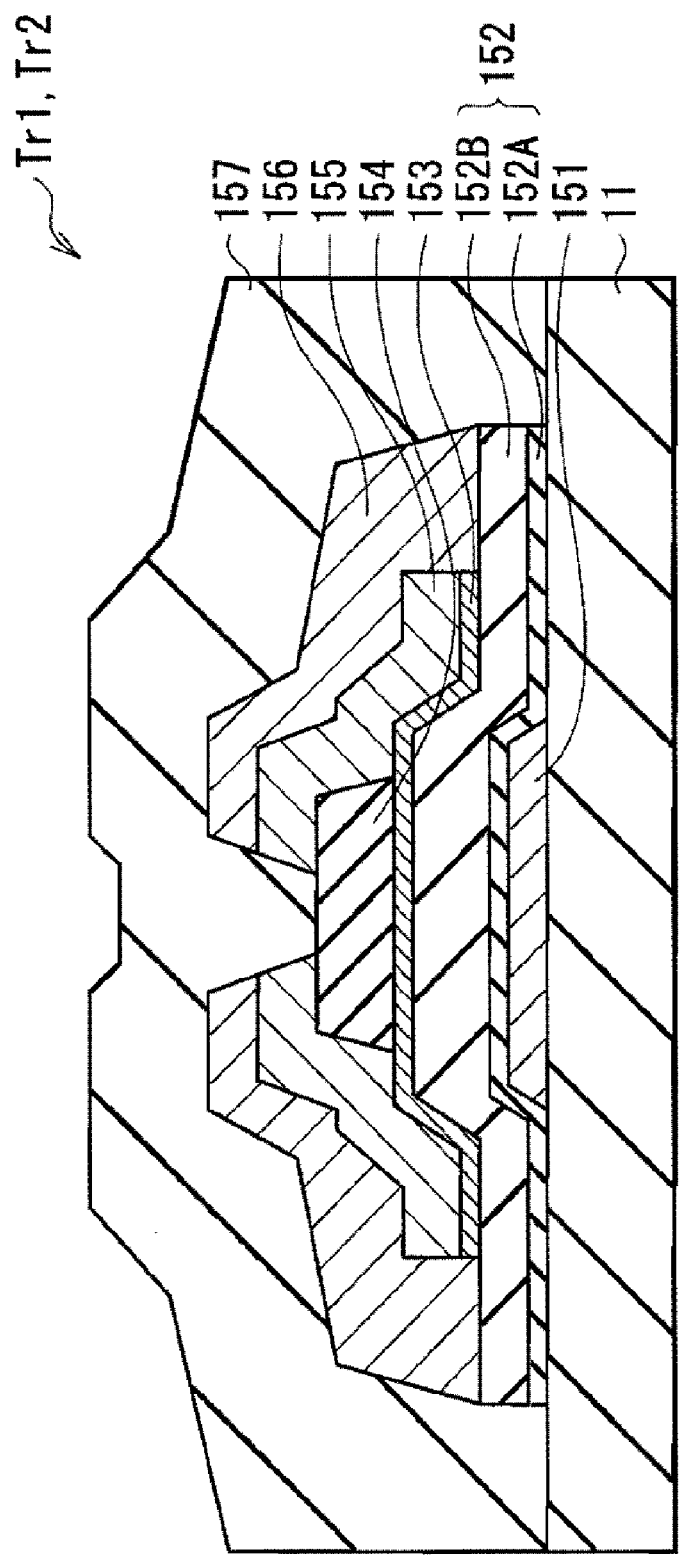
FIG. 3 is a sectional view showing an example of a drive transistor and a write transistor appearing in FIG. 2.

FIG. 3 shows an example of the drive transistor Tr1 and the write transistor Tr2. The drive transistor Tr1 and the write transistor Tr2 are typically thin film transistors of an inverse-stagger structure (what is called bottom gate TFT), in which a gate electrode 151, a gate insulating film 152, a semiconductor film 153, an etching stop layer 154, an n⁺a-Si layer 155, and source/drain electrode 156 are disposed in order on the insulating substrate 11, and finally the passivation film 157 is formed to cover the whole surface. It is to be noted that configurations of the drive transistor Tr1 and the write transistor Tr2 are not limited to the above in particular and may be of a stagger structure (top gate TFT).

The gate electrode 151 is made of a metal or an alloy containing at least one sort of refractory metals selected from the group consisting of molybdenum (Mo), chromium (Cr), titanium (Ti), tungsten (W) and tantalum (Ta) for example.

The gate insulating film 152 is structured in such a manner that a SiNx layer 152A (100 nm thick) and a SiOx layer 152B (200 nm thick) are stacked in order from the gate electrode 151 side, for example. Preferably, the thickness of the gate insulating film 152 is within a range of the order of 50 nm to 700 nm in total in consideration of the balance of leakage current and capacity.

The semiconductor film 153, which is typically formed to the thickness of 10 nm to 50 nm, is formed by annealing, in which an a-Si film is irradiated with a laser beam to obtain a polycrystalline silicon (p-Si) or a microcrystal silicon. This annealing process is necessary for reducing the induction of threshold shift of the drive transistor Tr1 or the write transistor Tr2. Namely, it is known that, in the thin film transistor used in an organic electro luminescence display, a long-time voltage application to the gate electrode may induce a shift of threshold voltage. What is worse, since the thin film transistor used in the organic electro luminescence display needs be continuously energized as long as the organic light emitting elements 10R, 10G, and 10B are emitting light, it is more liable to induce the threshold shift. When the threshold voltage of the drive transistor Tr1 shifts, the current amount passing through the drive transistor Tr1 is changed, thereby the luminance of the organic light emitting elements 10R, 10G, and 10B constituting each pixel is also changed. To reduce threshold shift for the drive transistor Tr1, it is useful to crystallize the semiconductor film 153 by annealing so that a channel region thereof may be formed of the polycrystalline silicon or microcrystal silicon.

The etching stop layer 154 is made of SiNx, SiOx, or SiON, and typically formed to the thickness of 50 nm to 500 nm, specifically, of the order of 200 nm.

The n⁺a-Si layer 155 is typically formed to the thickness of 10 nm to 300 nm, more specifically, of the order of 100 nm.

The source/drain electrode 156 has a stacked structure of an aluminum (Al) layer and a titanium (Ti) layer, for example.

Figure 4:
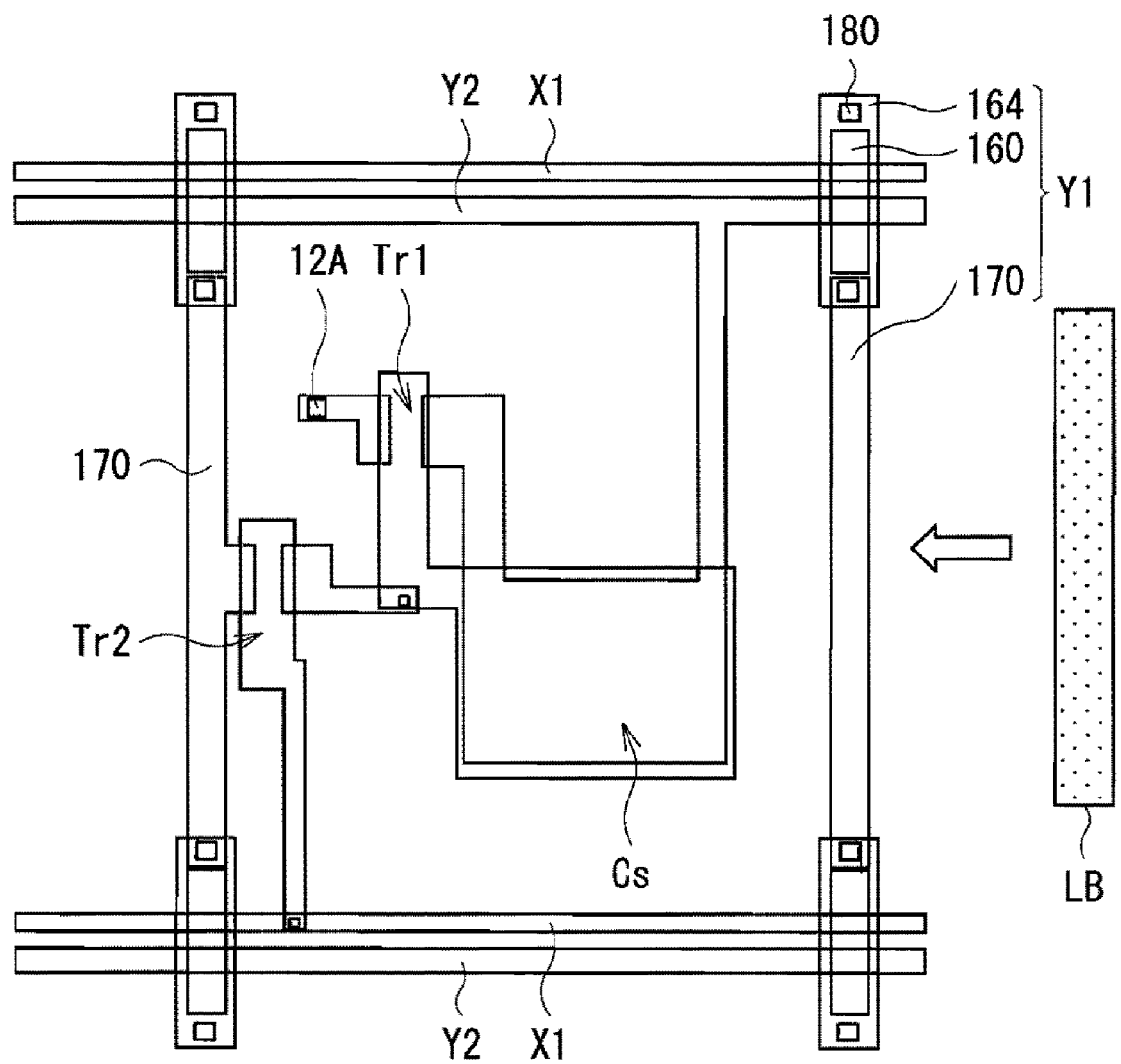
FIG. 4 is a plan view showing an example of the pixel driving circuit appearing in FIG. 2.
Figure 5:
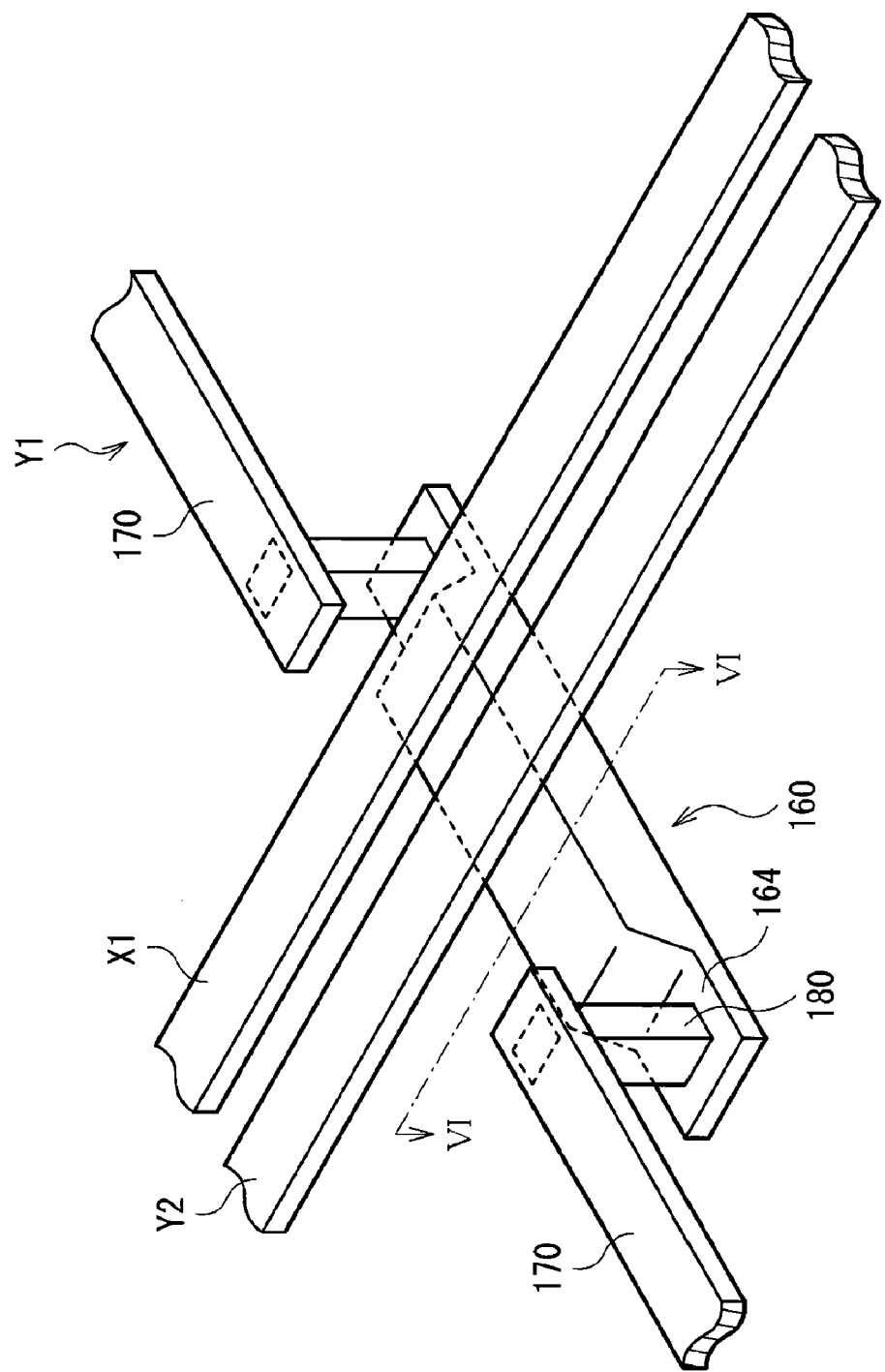
FIG. 5 is a perspective view showing the configuration of a gate wiring, current supply line and a source signal line at the intersection thereof.

FIG. 4 is a planar configuration of the pixel driving circuit 140 shown in FIG. 2, and FIG. 5 shows the intersection between the source signal line Y1 and the gate wiring X1 and the current supply line Y2 of FIG. 4. The gate wiring X1 and the current supply line Y2 are extending in the widthwise direction. The source signal line Y1 which extends in a lengthwise direction crosses perpendicular to the gate wiring X1 and the current supply line Y2.

The source signal line Y1 is divided into a main portion 170 and a crossing portion 160 at the intersection with the gate wiring X1 and the current supply line Y2. The crossing portion 160 is formed in a layer same as the gate electrode 151, and the main portion 170 is formed in a layer same as the source/drain electrode 156, gate wiring X1 and the current supply line Y2, with the gate insulating film 152 in between. The crossing portion 160 and the main portion 170 are electrically connected via a conductive connection 180 provided in the gate insulating film 152.

Figure 6:
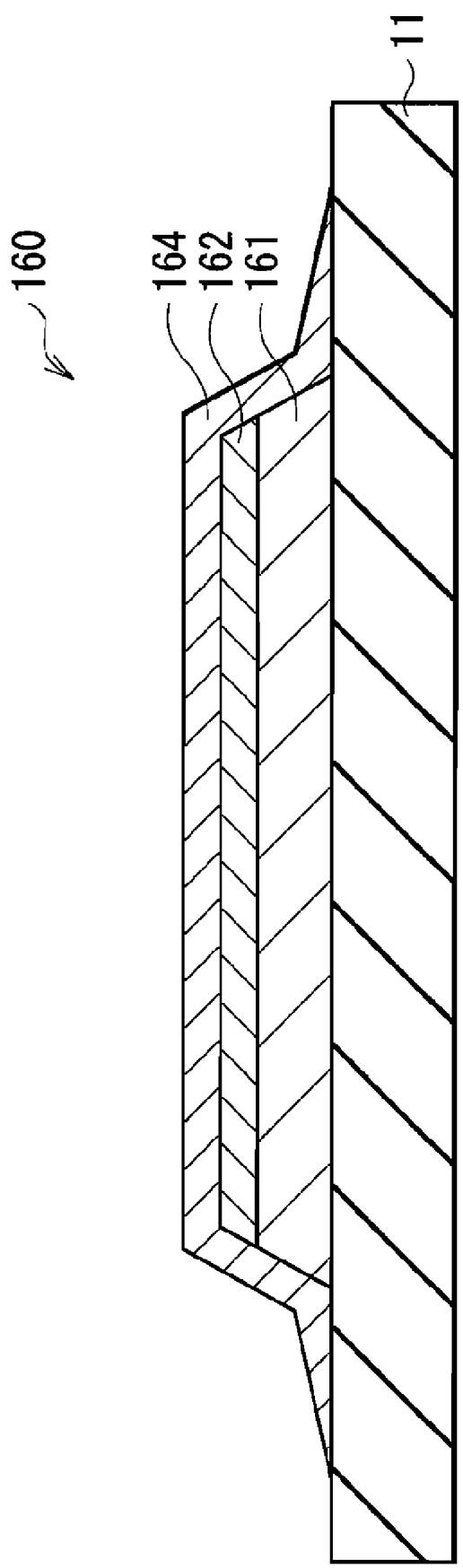
FIG. 6 is a sectional view showing the configuration of a crossing portion appearing in FIG. 5.

FIG. 6 shows a cross-sectional configuration of the crossing portion 160. The crossing portion 160 includes a first layer 161 and a second layer 162 made of a material having a higher melting point than the first layer 161 in order from the insulating substrate 11 side.

The first layer 161 is made of a metal or an alloy containing at least one sort of low resistance metal selected from the group consisting of aluminum (Al), copper (Cu) and silver (Ag) for example. Thickness of the first layer 161 needs to be determined in accordance with necessary resistance, but the thickness of the order of 50 nm to 1000 nm is preferable from a viewpoint of thermal resistance. Configuration of the first layer 161 may be a single structure or a stacked structure including two or more layers.

The second layer 162 is made of a material having a higher melting point than the first layer 161. More specifically, examples of a component material constituting the second layer 162 include a metal or alloy containing at least one selected from the group consisting of molybdenum (Mo), chromium (Cr), titanium (Ti), tungsten (W), tantalum (Ta), vanadium (V), niobium (Nb), nickel (Ni) and magnesium (Mg). Above all, what is called refractory metal or an alloy thereof, such as molybdenum (Mo), tungsten (W), tantalum (Ta), and niobium (Nb) are the most preferable. It may otherwise be constituted from a compound conductive material such as indium oxide or zinc oxide. It is necessary to adjust the thickness of the second layer 162 so as to prevent any trouble in the first layer 161 even when its thermal resistance is low, and it is preferred that the thickness is of the order of 10 nm to 200 nm for example. Configuration of the second layer 162 may be a single layer or a stacked structure including two or more layers.

Since the first layer 161 and the second layer 162 are continuously formed as mentioned later, they are in direct contact with each other without forming a natural surface oxide film in between. This makes it possible for the display unit to reduce a wiring resistance of the source signal line Y1, thereby improving the image quality.

The upper surface and side face of the crossing portion 160 are covered with a cap layer 164. Since the cap layer 164 covers the side of the first layer 161 so as to prevent it from exposure, even when the thermal resistance of the first layer 161 is low, the hillock etc., caused by annealing is suppressed. As a result, the pressure resistance of the gate insulating film 152 is improved. The cap layer 164 is made of a material or alloy containing at least one sort of refractory metal having a higher melting point than the first layer 161, as typically selected from the group consisting of molybdenum (Mo), tungsten (W), tantalum (Ta) and niobium (Nb).

The main portion 170 has a stacked structure of aluminum (Al) layer and titanium (Ti) layer similar to the source/drain electrode 156, for example.

Figure 9:
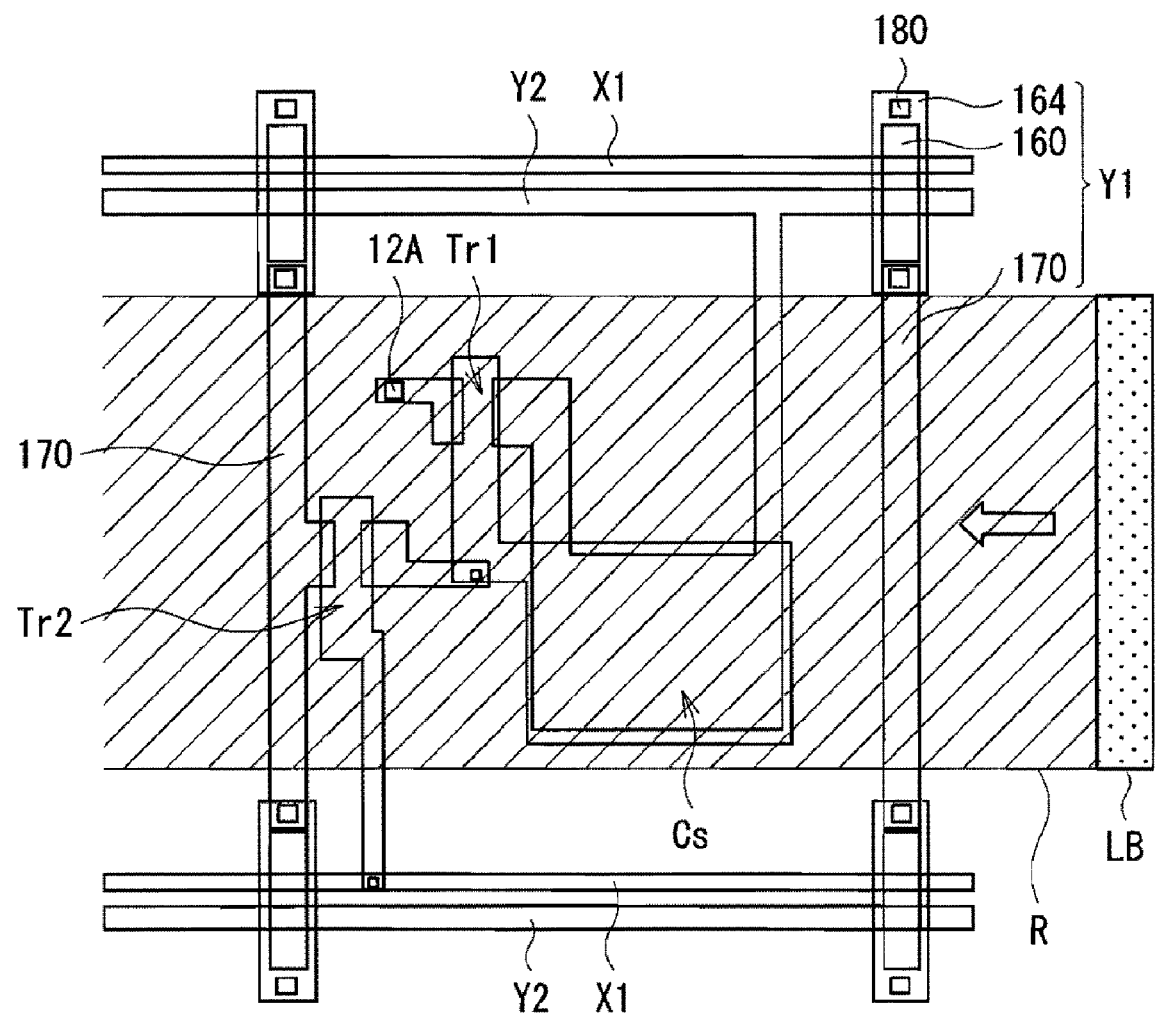
FIG. 9 is plan view of a step subsequent to FIGS. 8A and 8B.

Location of the crossing portion 160 and the main portion 170 is determined in consideration of an irradiation area R of the laser beam LB, for annealing the semiconductor film 153 as shown in FIG. 9. Here, the crossing portion 160 is formed outside the irradiation area R of the laser beam LB. Since irradiation with the laser beam LB is a heat treatment of 400° C. or higher, there may be a possibility of thermal resistance or diffusion in such high temperature even if the first layer 161, which is typically made of a low resistance metal, is covered with the second layer 162 which is mainly made of a refractory metal. Thus, it is preferred to form the crossing portion 160 outside the irradiation area R of the laser beam LB so as to avoid thermal damage given by the laser beam LB.

Figure 7:
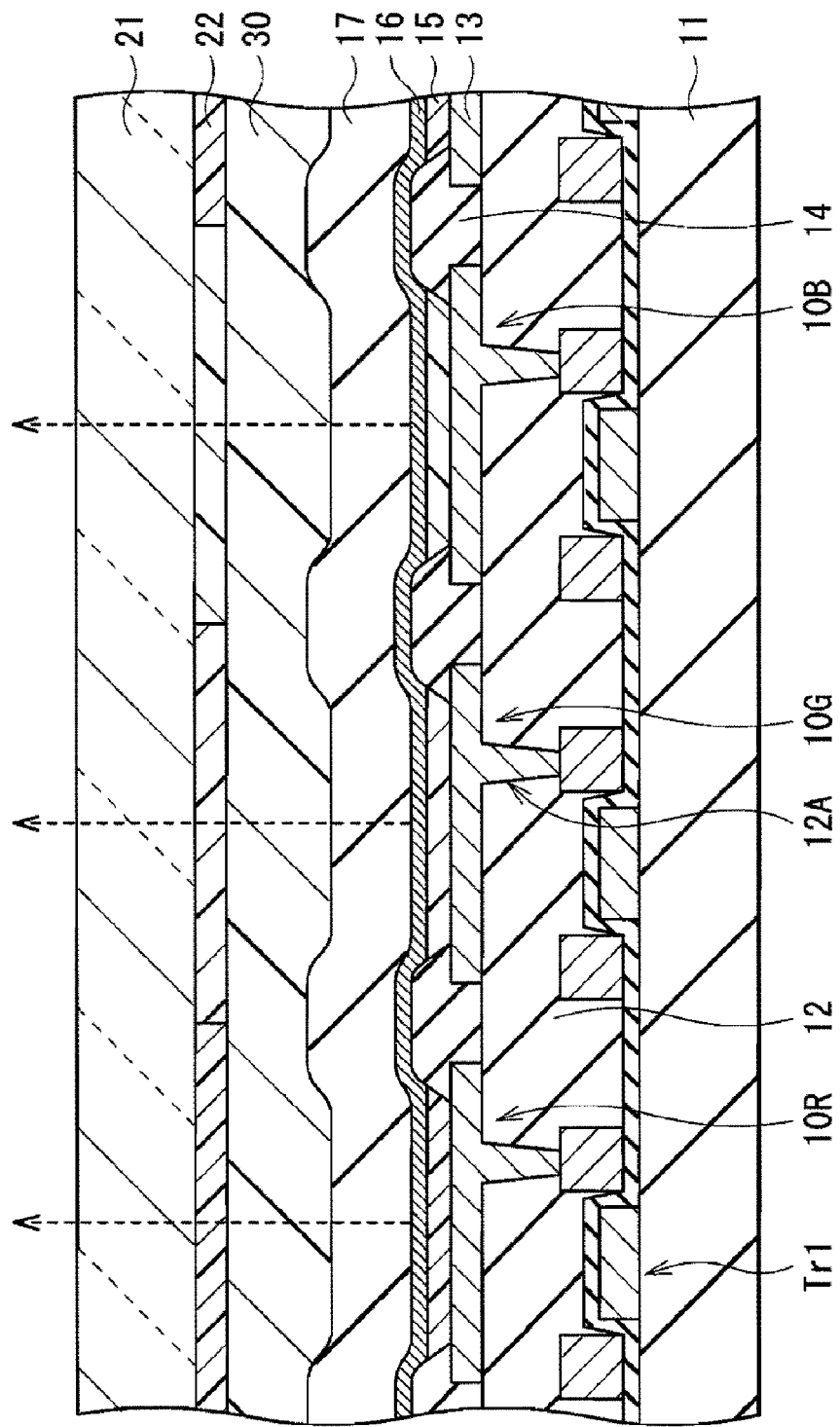
FIG. 7 is a sectional view showing the configuration of the display unit of FIG. 1.

FIG. 7 is a cross-sectional configuration of the display region 110. The organic light emitting element 10R which emits a red light, the organic light emitting element 10G which emits a green light, and the organic light emitting element 10B which emits a blue light are sequentially arrayed on the display region 110 so as to form a matrix as a whole. It is to be noted that the organic light emitting elements 10R, 10G, and 10B have a planar rectangular configuration, and combination of neighboring three organic light emitting elements 10R, 10G and 10B constitutes one pixel.

Each of the organic light emitting elements 10R, 10G and 10B is configured in such a manner that a drive transistor Tr1 provided in the above-mentioned pixel driving circuit 140, a planarization insulating film 12, a first electrode 13 as anode, an inter-electrode insulating film 14, an organic layer 15 including an after-mentioned light emitting layer, and a second electrode 16 as cathode are stacked in order from the substrate 11 side.

Such organic light emitting elements 10R, 10G, and 10B are covered as necessary with a protective film 17 typically made of silicon nitride (SiN) or silicon oxide (SiO). Then, a sealing substrate 21 typically made of glass is further laminated over the whole surface of the protective film 17, with an adhesive layer 30 typically made of a thermosetting resin or an ultraviolet curing resin in between, for the purpose of sealing. A color filter 22 and a light shielding film (not shown) as a black matrix may be disposed as necessary on the sealing substrate 21.

The drive transistor Tr1 is electrically connected to the first electrode 13 via a connection hole 12A provided in the planarization insulating film 12.

The planarization insulating film 12, which is necessary for planarizing the face of the substrate 11 on which the pixel driving circuit 140 is formed, is preferably made of a material having a good pattern accuracy for facilitating formation of a fine connection hole 12A. Examples of component materials of the planarization insulating film 12 include organic materials such as polyimide, and inorganic materials such as silicon oxide ($SiO_2$).

The first electrodes 13 are formed corresponding to the organic light emitting elements 10R, 10G and 10B, respectively. Since the first electrode 13 has a function as a reflecting electrode to reflect a light emitted from the light emitting layer, it is desirable to have the high possible reflectance as much as possible so as to raise the luminous efficiency. The first electrode 13, which is typically formed to the thickness of 100 nm to 1000 nm, is made of a simple substance or alloy of such metallic element as silver (Ag), aluminum (Al), chromium (Cr), titanium (Ti), iron (Fe), cobalt (Co), nickel (Ni), molybdenum (Mo), copper (Cu), tantalum (Ta), tungsten (W) platinum (Pt) and gold (Au).

The inter-electrode insulating film 14 secures insulation between the first electrode 13 and the second electrode 16 and accurately secures a desired shape of the light-emitting region. It is typically made of an organic material such as polyimide, or an inorganic insulating material such as silicon oxide ($SiO_2$). Here, openings are provided in the inter-electrode insulating film 14 corresponding to the respective light-emitting regions in the first electrode 13. The organic layer 15 and the second electrode 16 may be extended continuously not only on the light-emitting region but also on the inter-electrode insulating film 14. Anyway, light is emitted only through the openings provided in the inter-electrode insulating film 14.

The organic layer 15 here is structured in such a manner that a hole injection layer, a hole transport layer, a light emitting layer and an electron transport layer (none of them are illustrated) are stacked in order from the first electrode 13 side. However, they are not always indispensable except the light emitting layer, and may be provided if necessary. In addition, the organic layer 15 may be configured differently depending on the emission color of the respective organic light emitting elements 10R, 10G and 10B. The hole injection layer increases the hole injection efficiency as well as works as a buffer layer for preventing leakage current. The hole transporting layer has a function of increasing the efficiency in transporting holes to the light emitting layer. The light emitting layer emits light when an electric field is applied because that induces the recombination of electrons and holes. The electron transport layer increases the efficiency in transporting electrons to the light emitting layer. The component material of the organic layer 15 may be a general low-molecular or polymeric organic material, and is not limited in particular.

The second electrode 16, which is typically formed to the thickness of 5 nm to 50 nm, is made of a simple substance or alloy of a metallic element such as aluminum (Al), magnesium (Mg), calcium (Ca), and sodium (Na) Above all, an alloy of magnesium and silver (MgAg alloy) or an alloy of aluminum (Al) and lithium (Li) (AlLi alloy) are desirable. The second electrode 16 may be made of ITO (indium-tin composite oxide) or IZO (indium-zinc composite oxide).

This display unit may be manufactured in a manner as described below, for example.

FIGS. 8A, 8B and 9 are views for explaining the method of manufacturing the display unit. The method of manufacturing the display unit typically includes a step of forming the above-mentioned pixel driving circuit 140 on the substrate 11, and a step of forming the organic light emitting elements 10R, 10G and 10B.

Step of Forming the Pixel Driving Circuit 140

First, as shown in FIG. 8A, the first layer 161 and second layer 162 of the material and thickness as mentioned above, are continuously formed on the substrate 11 of the above-mentioned material typically by a sputtering method, without being exposed to the atmosphere. Then, they are formed into a predetermined shape by photolithography and etching for example, so as to obtain the crossing portion 160. Since the first and the second layers 161 and 162 are continuously formed, they are in direct contact with each other to prevent formation of natural oxidation film or the like having a characteristic as a resistance component. This allows the crossing portion 160 to reduce its resistance, thereby enabling to reduce the wiring resistance of the source signal line Y1.

Subsequently, as shown in FIG. 8B, the cap layer 164 made of the above-mentioned material is formed typically by a sputtering method and formed into a predetermined shape typically by photolithography and etching so that the upper surface and the side face of the crossing portion 160 are covered with the cap layer 164. Simultaneously, the gate electrode 151 is formed using the same component material as the cap layer 164. In this manner, production process is simplified.

Subsequently, the gate insulating film 152 and the semiconductor film 153 of the material and thickness as mentioned above are formed typically by plasma CVD (chemical vapor deposition).

Then, the semiconductor film 153 is irradiated with the laser beam LB for annealing using a solid state laser oscillator so as to crystallize a-Si constituting the semiconductor film 153. At this time, as shown in FIG. 4, the laser beam LB has its lengthwise dimension a little narrower than that of the pixel size and scanning along the minor axial direction of pixels. Namely, since the irradiation area R of the laser beam LB is defined by the shaded portion of FIG. 9, it is shown that the drive transistor Tr1 and the write transistor Tr2 are formed within the irradiation area R of the laser beam LB but the crossing portion 160 is formed outside the irradiation area R. Since irradiation of the laser beam LB is able to thus avoid the crossing portion 160, that allows the first layer 161 not only to prevent from being damaged due to a high temperature heating of 400° C. or higher under laser irradiation, but also to be processed at a high processing speed.

Otherwise, as the laser beam LB, an excimer laser beam having the same minor-axial dimension as the pixel size may be employed so that irradiation is applied by repetition of pixel-length step moving and pulse irradiation in the minor-axial direction.

After irradiating the semiconductor film 153 with the laser beam LB, the etching stop layer 154 of the above-mentioned thickness and material is formed on the crystallized semiconductor film 153, then it is formed into a predetermined shape by an etching process for example so that the etching stop layer 154 may be left only on an area which will finally become the channel region.

After forming the etching stop layer 154, the n$^+$a-Si layer 155 of the above-mentioned thickness is formed on the etching stop layer 154 and the crystallized semiconductor film 153 by a CVD process for example, then is formed into a predetermined shape typically by etching.

After forming the n$^+$a-Si layer 155, the source/drain electrode 156 of the above-mentioned material is formed thereon by sputtering for example, then it is formed into a predetermined shape typically by etching. At this time, the gate wiring X1, the current supply line Y2, and the main portion 170 of the source signal line Y1 made of the above-mentioned materials are also formed and connected to the source/drain electrode 156. The main portion 170 of the source signal line Y1 is connected to the crossing portion 160 via the conductive connection 180 provided in the gate insulating film 152. In addition, the passivation film 157 is formed to cover the whole surface. In this manner, the pixel driving circuit 140 as shown in FIGS. 1 to 6 is thus completed.

Step of Forming the Organic Light Emitting Elements 10R, 10G and 10B

Subsequently, the planarization insulating film 12 is formed by typically applying the above-mentioned material on the pixel driving circuit 140 by, for example a spin coat method then exposing and developing it.

After that, on the planarization insulating film 12, the first electrode 13 made of the above-mentioned material is formed by DC sputtering for example, then selectively etched by lithography technology for example, to be patterned into a predetermined shape. Subsequently, the inter-electrode insulating film 14 of the above-mentioned thickness and material is formed typically by CVD, then openings are formed in the inter-electrode insulating film 14 using a lithography technology for example. After that, the organic layer 15 and the second electrode 16 of the above-mentioned materials are formed sequentially by an evaporation method for example so as to obtain the organic light emitting elements 10R, 10G and 10B. Then, the protective film 17 made of the above-mentioned material is formed so as to cover the organic light emitting elements 10R, 10G and 10B.

Subsequently, the adhesive layer 30 is formed on the protective film 17. Then, the sealing substrate 21 made of the above-mentioned material and provided with the color filter is prepared. Then the substrate 11 and the sealing substrate 21 are bonded together with the adhesive layer 30 in between. In this manner, the display unit as shown in FIG. 7 is thus completed.

In the display unit, when a given voltage is applied across the first electrode 13 and the second electrode 16, current passes through the light emitting layer of the organic layer 15 to induce the recombination of holes and electrons, thereby light emission occurs. This light transmits the second electrode 16, the protective film 17 and the sealing substrate 21 and is extracted. Here, the source signal line Y1 is divided into the main portion 170 and the crossing portion 160, and in the crossing portion 160, the first layer 161 made of a low resistance metal and the second layer 162 made of a material having a higher melting point than that of the first layer 161 are in direct contact with each other so as to reduce the resistance of the crossing portion 160. This realizes a smaller wiring resistance of the source signal line Y1, thereby suppressing a distortion of signal waveform and transmission delay of signals, etc., to improve the image quality.

As mentioned above, in the display unit of the present embodiment, since the source signal line Y1 is divided into the crossing portion 160 and the main portion 170, and in the crossing portion 160, the first layer 161 is in direct contact with the second layer 162 made of a material having a higher melting point than the first layer 161, the resistance of the crossing portion 160 is lowered. This allows the source signal line Y1 to reduce the wiring resistance, thereby suppressing a distortion of signal waveform and transmission delay of signals and so on, to improve the display quality. In addition, in the display unit of the present embodiment, since the first layer 161 and the second layer 162 is formed sequentially, the process of manufacturing the display unit of the present embodiment is simplified. In particular, it is suitably applied to organic electro luminescence displays, in which light-emitting performance is susceptible to the fluctuation in the amount of current flow caused by the threshold shift in the drive transistor Tr1.

Second Embodiment

Figure 10:
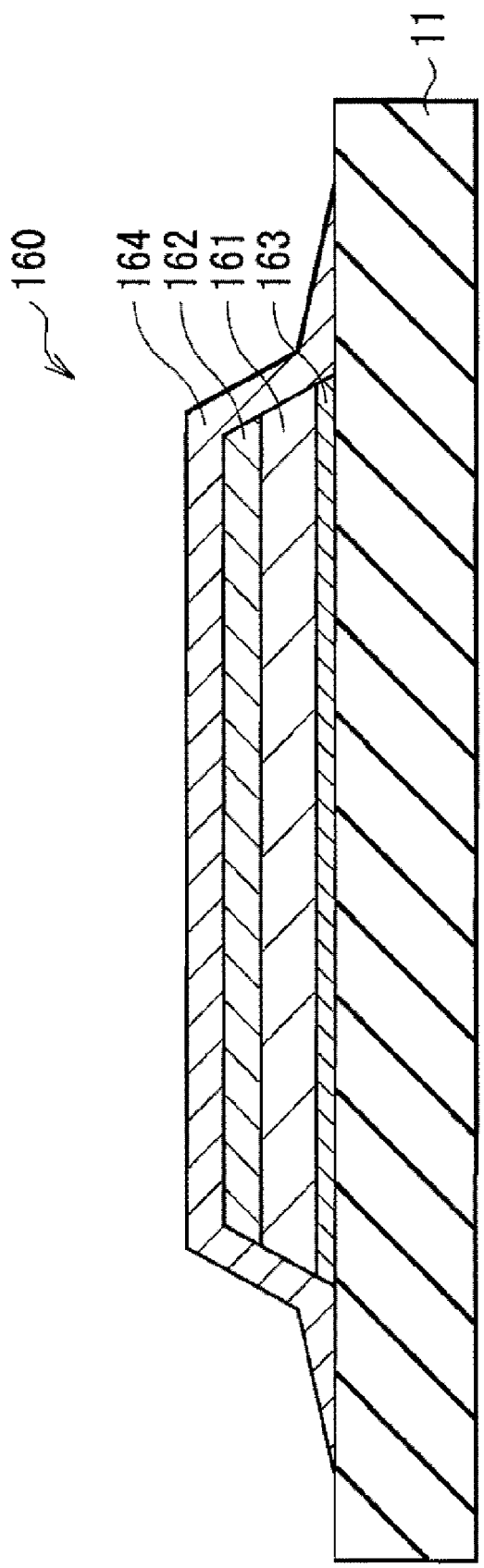
FIG. 10 is a sectional view showing the configuration of a crossing portion of a source signal line provided in a display unit according to a second embodiment of the present invention.

FIG. 10 is a cross-sectional configuration of a crossing portion 160 constituting a source signal line Y1 provided in a display unit according to a second embodiment of the present invention. The present embodiment is the same as that of the first embodiment except for adding a third layer 163 between an insulating substrate 11 and a first layer 161 so that the crossing portion 160 may become a three-layer structure. Thus, hereinbelow, component elements corresponding to those in the first embodiment are denoted by the same reference numerals.

The third layer 163 is provided to cover the undersurface of the first layer 161, which is made of a low resistance metal, so that the first layer 161 is reliably protected from a thermal damage given by the laser irradiation heating and pressure resistance of the gate insulating film 152 is further improved. Therefore, the third layer 163 is made of a material having a higher melting point than the first layer 161. More specifically, examples of a component material constituting the third layer 163 include a metal or alloy containing at least one selected from the group consisting of molybdenum (Mo), chromium (Cr), titanium (Ti), tungsten (W), tantalum (Ta) vanadium (V), niobium (Nb), nickel (Ni) and magnesium (Mg) Otherwise, the third layer 163 may be made of a compound conductive material such as indium oxide or zinc oxide. It is preferred that the third layer 163 is formed to the thickness of 10 nm to 200 nm for example because it is preferred for fabrication convenience that the second layer 162, the first layer 161 and the third layer 163 are etched collectively so that their cross sections may be forward tapered in shape. The third layer 163 may be a single layer or a stacked structure including two or more layers.

It is to be noted that, in the present embodiment, among the first to third layers 161 to 163 constituting the crossing portion 160, it is enough if at least the first layer 161 and the second layer 162 are in direct contact with each other. This is because the third layer 163 exerts no direct influence on the wiring resistance since the main portion 170 of the source signal line Y1 is connected to the second layer 162 via the cap layer 164. It is also desirable that the third layer 163 is separated from the first layer 161 by a natural oxidation film to avoid a direct contact to each other. This is because it is desirable that a direct contact between layers is avoided via a natural oxidation film as far as they do not affect resistance, and the third layer 163 is a portion hardly exerting influence on the wiring resistance. However, since continuous film formation is more simple in manufacturing, the third layer 163 may be continuously formed on the first layer 161 in direct contact therewith.

The display unit may be manufactured in a manner similar to the first embodiment except that the third layer 163 of the above-mentioned thickness and material, the first layer 161 and the second layer 162 are stacked in order from the insulating substrate 11 side upon formation of the crossing portion 160. In this case, the third layer 163, the first layer 161 and the second layer 162 may be continuously formed, or only the first layer 161 and the second layer 162 may be continuously formed.

Third Embodiment

Figure 11:
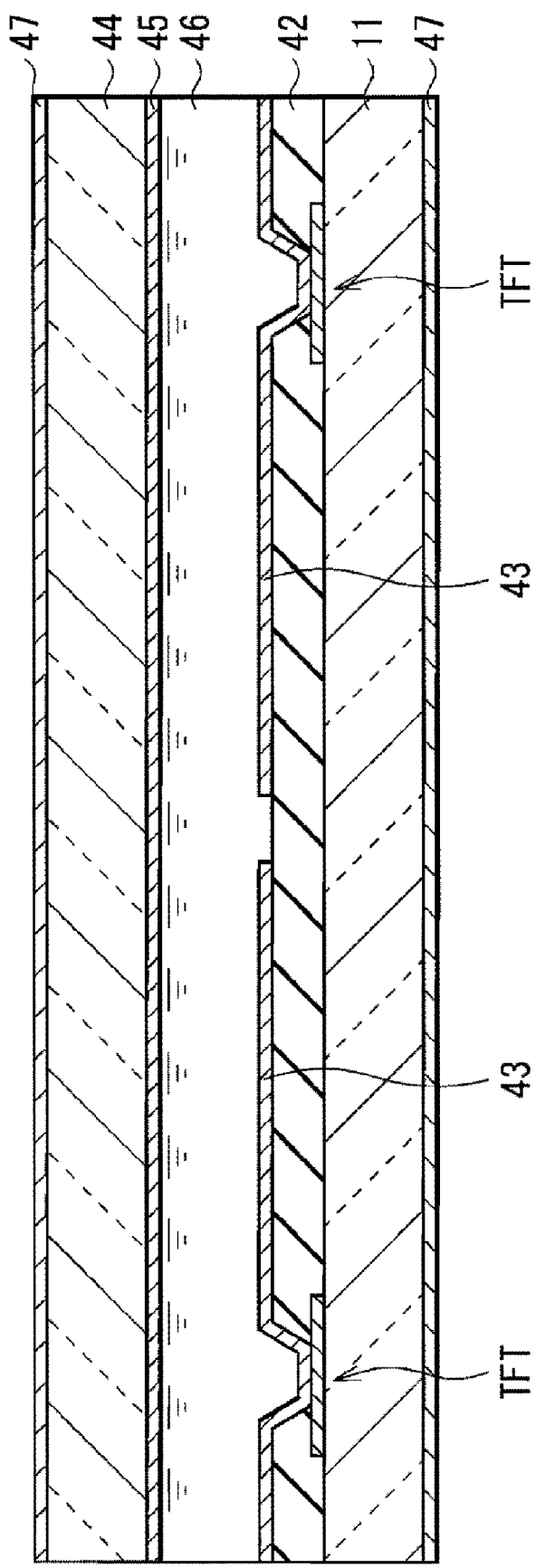
FIG. 11 is a sectional view showing the configuration of a display unit according to a third embodiment of the present invention.

FIG. 11 shows an example of the cross-sectional configuration when the present invention is applied to a liquid crystal display. The present embodiment is completely the same as the above-mentioned first and second embodiments except that the display element is constituted from a liquid crystal display element, and its operation and effects are also the same. Thus, component elements corresponding to those in the first and the second embodiments are denoted by the same reference numerals in description.

Although configuration of the liquid crystal display element is not limited in particular, here, as shown in FIG. 11, TFT is formed on the insulating substrate 11 corresponding to each pixel, and a planarization insulating film 42 and a pixel element electrode 43 made of ITO (indium-tin oxide) are formed thereon for example. A common electrode 45 which is made of ITO and is formed on an opposing substrate 44 made of glass etc. is arranged to face the pixel element electrode 43, with a liquid crystal layer 46 in between. Polarizing plates 47 are formed on the substrate 11 and the opposing substrate 44, respectively so that their optical axes (not shown) are orthogonal to each other. It is to be noted that other TFTs, capacitive elements, wiring and so on are provided on the insulating substrate 11 though not illustrated.

MODULE AND APPLICATION EXAMPLE

Application examples for the display unit according to the above-mentioned embodiments will be described hereinbelow. The display unit of the above-mentioned embodiments is applicable to a display of electronic equipments in any field, such as TV apparatus, digital camera, laptop personal computer, personal digital assistant device including a portable telephone and video camera, as far as they display a video signal that is inputted from outside or generated inside as an image or video.

Module

Figure 12:
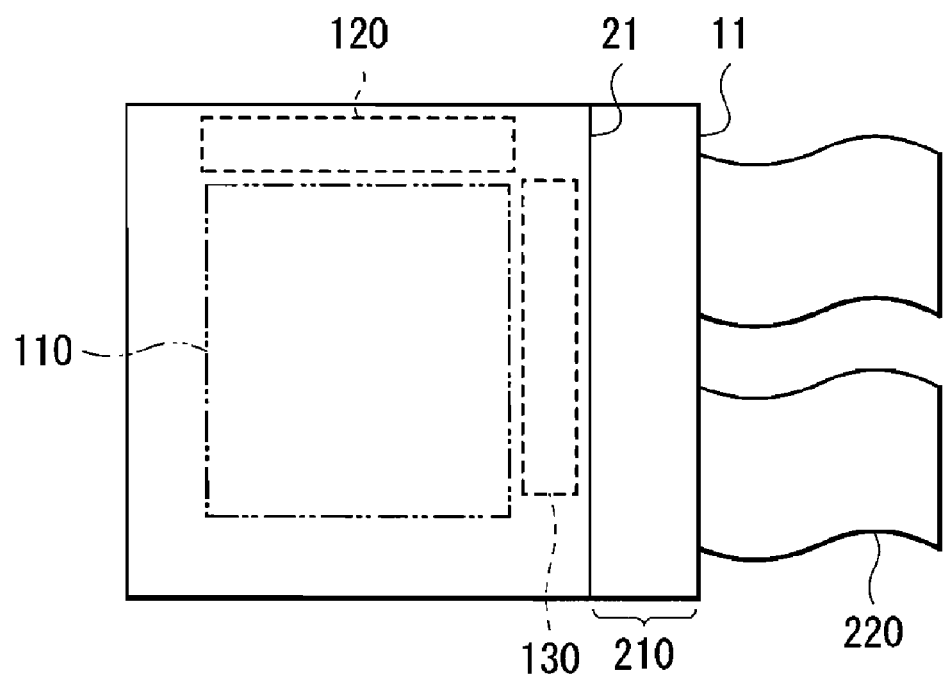
FIG. 12 is a plan view showing the schematic constitution of a module which includes the display unit according to the first to third embodiments.

The display unit of the above-mentioned embodiments is built in a various types of electronic equipments as shown in the after-mentioned application examples 1 to 5, as a module as shown in FIG. 12. The module is typically configured in such a manner that an exposed region 210 is provided on one side of a substrate 11 in such a manner as being exposed from sealing substrate 21 and adhesive layer 30 so that wirings of a signal line driving circuit 120 and a scanning line driving circuit 130 may be extending toward the exposed region 210 to form an external connection terminal (not shown) thereon. The external connection terminal may include a flexible printed circuit (FPC) 220 for inputting/outputting signals.

Application Example 1

Figure 13:
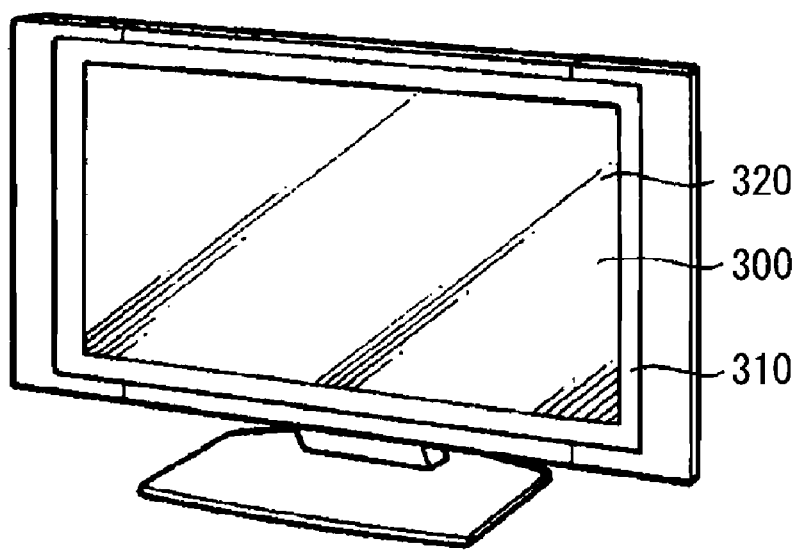
FIG. 13 is a perspective view showing an external appearance of application example 1, to which the display unit of the first to third embodiments is applied.

FIG. 13 shows an external appearance of a TV apparatus to which the display unit of the above-mentioned embodiments is applied. The TV apparatus includes an image display screen 300 which includes a front panel 310 and a filter glass 320, for example, and the image display screen 300 is constituted from the display unit of the above-mentioned embodiments.

Application Example 2

Figure 14A:
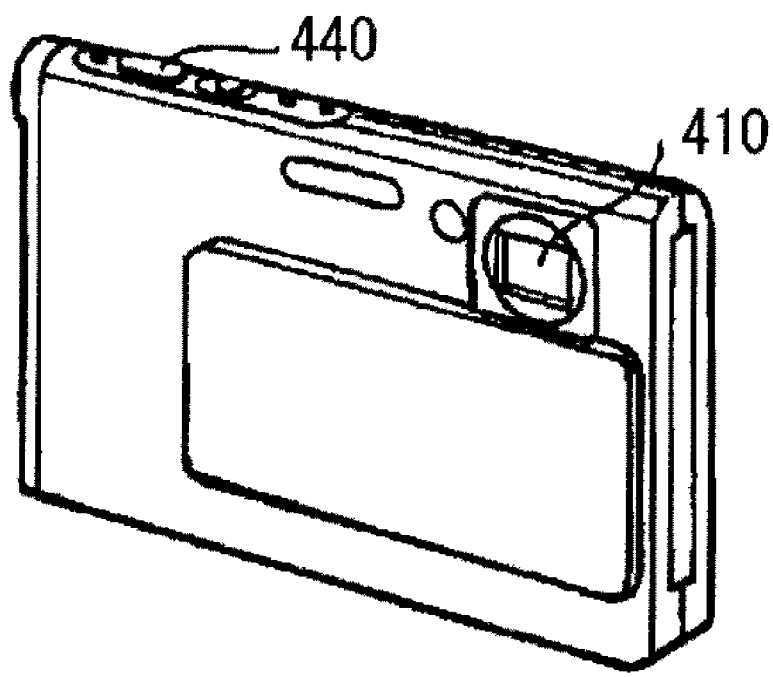
FIG. 14A is a perspective view showing an external appearance of application example 2 as seen from the front side, and FIG
Figure 14B:
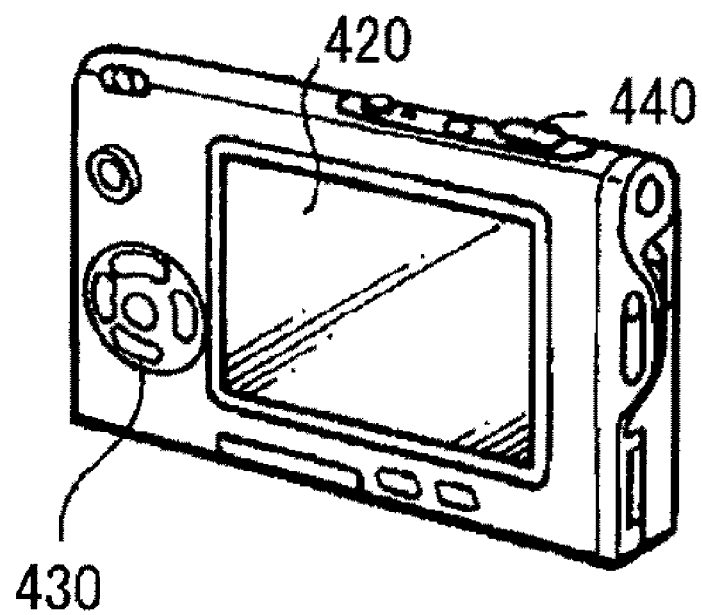
FIG. 14B is a perspective view thereof as seen from the backside.

FIGS. 14A and 14B show external appearance of a digital camera to which the display unit of the above-mentioned embodiment is applied. The digital camera includes a light-emitting flash portion 410, a display portion 420, a menu switch 430 and a shutter button 440 for example, and the display portion 420 is constituted from the display unit of the above-mentioned embodiments.

Application Example 3

Figure 15:
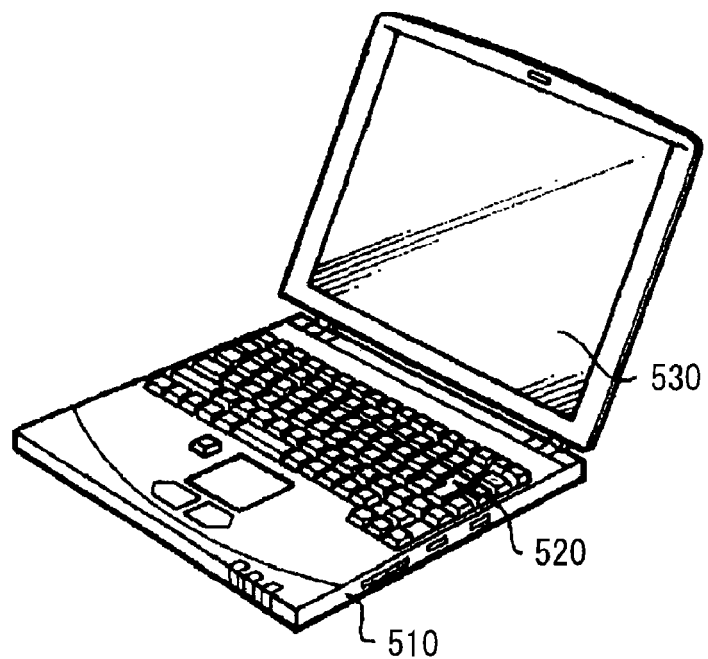
FIG. 15 is a perspective view showing an external appearance of application example 3.

FIG. 15 shows an external appearance of a laptop personal computer to which the display unit of the above-mentioned embodiments is applied. The laptop personal computer includes a body 510, a keyboard 520 for inputting characters etc., and a display portion 530 which displays an image for example, and the display portion 530 is constituted from the display unit of the above-mentioned embodiments.

Application Example 4

Figure 16:
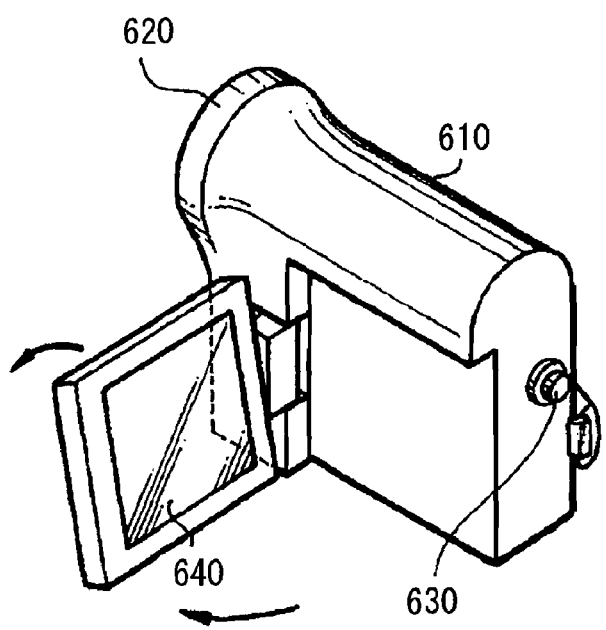
FIG. 16 is a perspective view showing an external appearance of application example 4.
Figure 17:
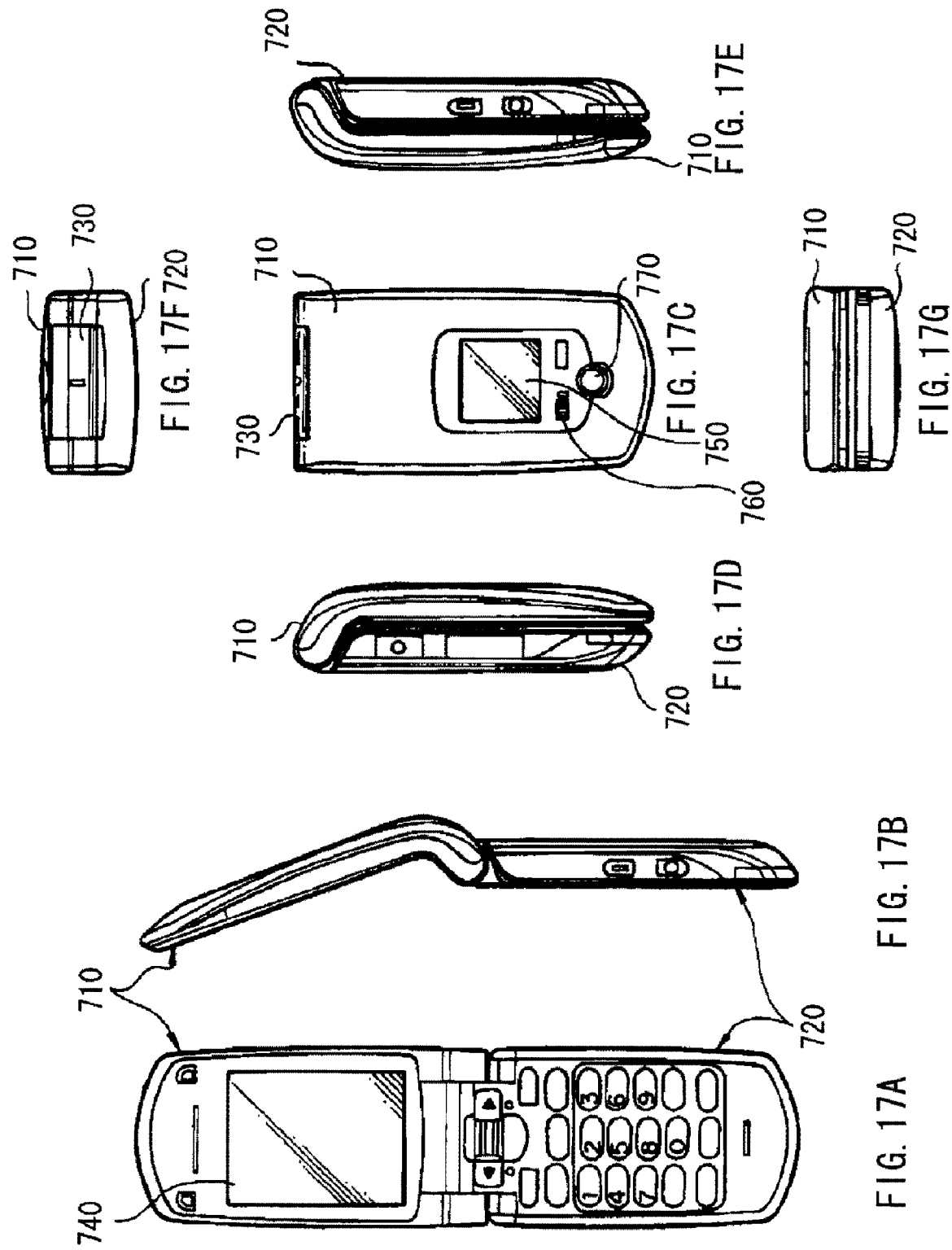
FIG. 17A is a front elevation view of application example 5 when it is opened.
FIG. 17B is a side elevation view thereof.
FIG. 17C is a front elevation view of the application example 5 when it is closed.
FIG. 17D is a left side view thereof.
FIG. 17E is a right side view and FIG. 17F is a top view thereof.
FIG. 17G is a bottom view thereof.

FIG. 16 shows an external appearance of a video camera to which the display unit of the above-mentioned embodiments is applied. The video camera includes a body portion 610, a lens 620 which is installed on the front face of the body portion 610 for shooting objects, a start/stop switch 630 to be operated when shooting, and a display portion 640, for example. The display portion 640 is constituted form the display unit of the above-mentioned embodiments.

Application Example 5

FIGS. 17A to 17G show external appearance of a portable telephone to which the display unit of the above-mentioned embodiments is applied. The portable telephone is configured in such a manner that an upper housing 710 and a lower housing 720 are connected with a connection point (hinge portion) 730, and includes a display 740, a sub display 750, a picture light 760 and a camera 770, for example. The display 740 or the sub display 750 is constituted from the display unit of the above-mentioned embodiments.

EXAMPLES

Further, detailed examples of the present invention will be explained hereinbelow.

Example 1

The pixel driving circuit 140 was formed in a manner similar to the above-mentioned first embodiment. First, the first layer 161, which was made of an Al—Nd alloy to the thickness of 300 nm, and the second layer 162, which was made of molybdenum (Mo) to the thickness of 50 nm, were continuously formed by a sputtering process on the insulating substrate 11 made of glass, without being exposed to the atmosphere. Then, they were formed into a predetermined shape by photolithography and etching to obtain the crossing portion 160 (refer to FIG. 8A).

Subsequently, the cap layer 164 which was made of molybdenum (Mo) was formed by a sputtering process, then formed into a predetermined shape by photolithography and etching so as to cover the upper surface and side faces of the crossing portion 160. Simultaneously, the gate electrode 151 was formed with the same material as the cap layer 164 (refer to FIG. 8B).

Subsequently, the gate insulating film 152 and the semiconductor film 153 were formed by plasma CVD. The gate insulating film 152 had a stacked structure including a SiNx layer 152A (100 nm thick) and a SiOx layer 152B (200 nm thick). The semiconductor film 153 was made of amorphous silicone (a-Si) and formed to the thickness of 30 nm.

After that, the semiconductor film 153 was irradiated with the laser beam LB (annealing) using a solid state laser oscillator so as to crystallize a-Si constituting the semiconductor film 153. At this time, when the laser beam LB scanning along the minor axial direction of pixels, the lengthwise dimension of the laser beam LB was made a little narrower than that of the pixel size as shown in FIG. 4 so that the laser beam LB is irradiated to the irradiation area defined by the shaded area as shown in FIG. 9, avoiding the crossing portion 160.

After irradiating the semiconductor film 153 with the laser beam LB, the etching stop layer 154 which was made of SiNx to the thickness of 200 nm was formed on the crystallized semiconductor film 153, and was formed into a predetermined shape by an etching process so that the etching stop layer 154 was left only in an area which would finally become the channel region.

After forming the etching stop layer 154, the n$^+$a-Si layer 155 was formed to the thickness of 100 nm by a CVD process on the etching stop layer 154 and the crystallized semiconductor film 153, and was formed into a predetermined shape by an etching process.

After forming the n$^+$a-Si layer 155, the source/drain electrode 156, which was formed by stacking an aluminum (Al) layer and a titanium (Ti) layer by a sputtering method, were formed thereon and then formed into a predetermined shape by an etching process. At the same time, the gate wiring X1, the current supply line Y2, and the main portion 170 of the source signal line Y1 were also formed similarly by stacking an aluminum (Al) layer and a titanium (Ti) layer, and were connected to the source/drain electrode 156. The main portion 170 of the source signal line Y1 was connected to the crossing portion 160 via the conductive connection 180, which was provided in the gate insulating film 152. Further, the passivation film 157 was formed to cover the whole surface. In this manner as mentioned above, the pixel driving circuit 140 shown in FIGS. 1 to 6 was fabricated.

Example 2

The pixel driving circuit 140 was formed in a manner similar to the above-mentioned Example 1 except for having made the crossing portion 160 a three-layer structure as with the above-mentioned second embodiment. At that time, the third layer 163 was made of molybdenum (Mo) to the thickness of 50 nm. The first layer 161 and the second layer 162 were continuously formed without being exposed to the atmosphere.

Comparative Example 1

A pixel driving circuit was formed in a manner similar to the above-mentioned Example 1 except that a first layer was once exposed to the atmosphere after formation then a second layer was formed a several hours later.

Comparative Example 2

Figure 18:
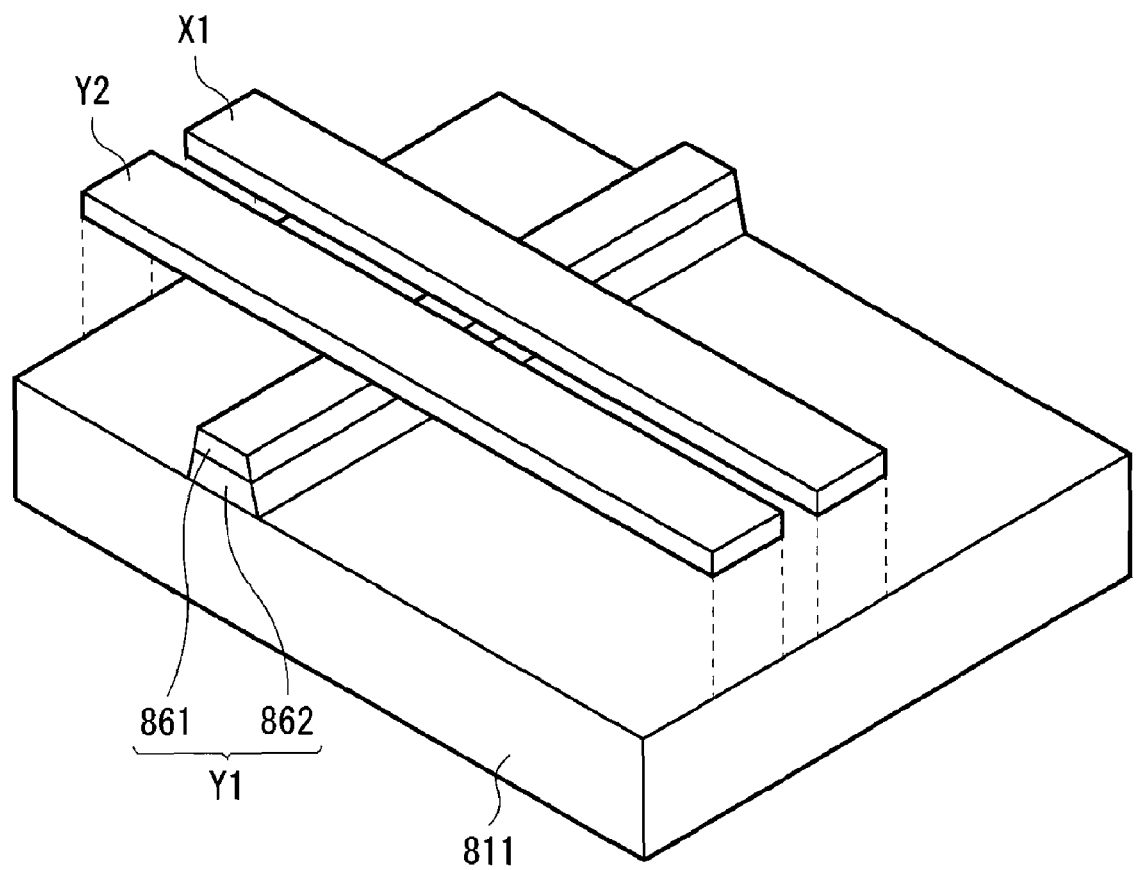
FIG. 18 is a perspective view showing the configuration of a gate wiring, current supply line and a source signal line at the intersection thereof according to comparative example 2.

A pixel driving circuit, in which wiring was not divided as shown in FIG. 18, was formed. First, a whole source signal line Y1 was formed on an insulating substrate 811. As viewed in its cross-section, the source signal line Y1 was structured as a stacked structure made of a first layer and a second layer as with the crossing portion 160 of Example 1. However, the first and second layers were not formed continuously. More specifically, after forming a first layer 861 made of an Al—Nd alloy to the thickness of 300 nm by a sputtering method, it was exposed to the atmosphere. Several hours later, a second layer 862 made of molybdenum (Mo) to the thickness of 50 nm was formed, then they were formed into a predetermined shape by photolithography and etching.

Subsequently, a drive transistor Tr1 and the like were formed in a manner similar to Example 1 except that the laser irradiation to the semiconductor film was not performed. A gate wiring X1 and a current supply line Y2 having a stacked structure of an aluminum (Al) layer and a titanium (Ti) layer were formed when source/drain electrode was formed, then they were connected to the source/drain electrode.

Evaluation of Wiring Resistance

Measurement of wiring resistance was conducted for the respective source signal lines obtained in Examples 1 and 2 and Comparative examples 1 and 2 across both ends of the respective wirings (300 mm in length and 5 μm in width). A lead section of a stacked structure including an aluminum (Al) layer and a titanium (Ti) layer was formed at both ends of the respective wirings of the measurement points so that a contact terminal for measurement was in contact with the lead section for measurement. The results are shown in Table 1.

TABLE 1

| | Source signal line | first layer | Second layer | Third layer | Continuous Formation (direct contact) of $1^{st}/2^{nd}$ layers | Laser | Wiring resistance (KΩ) |
|---|---|---|---|---|---|---|---|
| Example 1 | divided | Al—Nd | Mo | — | conducted | irradiated | 10 |
| Example 2 | divided | Al—Nd | Mo | Mo | conducted | irradiated | 10 |
| Comparative Example 1 | divided | Al—Nd | Mo | — | Not conducted | irradiated | 60 |
| Comparative Example 2 | No divided | Al—Nd | Mo | — | Not conducted | Not irradiated | 10 |

As shown in Table 1, as for Examples 1 and 2 in which the crossing portion 160 was formed by continuously forming the first layer 161 and the second layer 162, the wiring resistance was equal to the resistance of Al—Nd alloy, which was the component material of the first layer 161. On the other hand, as for Comparative example 1 in which the first layer and the second layer were not continuously formed, the wiring resistance was equal to the resistance of molybdenum (Mo), which was the component material of the second layer 162. It is to be noted that in the case of Comparative example 2, the wiring resistance was suppressed to the level same as the resistance of Al—Nd alloy even though the first layer and the second layer was not formed continuously. That may be because it was possible for the source signal line Y1, in which its entire wiring had a stack structure of the first and second layers without divided wiring, to ignore the influence of resistance components such as surface oxide film and so on, since the first and second layers were connected by pinhole or the like at several points. Further, that may be because the first layer was not subject to thermal damage by the irradiation heat since no laser irradiation was conducted, or the like.

Namely, it was fond out that when the source signal line Y1 was divided into the crossing portion 160 and the main portion 170, and the crossing portion 160 was constituted in such a manner as continuously forming the first layer 161 and the second layer 162 made of a material having a higher melting point than the first layer 161 so that both layers were in direct contact with each other, the resistance of the crossing portion 160 was lowered so that the wiring resistance in the source signal line Y1 was reduced.

Pressure Proof Evaluation

Pressure proof evaluation was conducted on Examples 1 and 2 and Comparative example 2. The first and second layers were formed for Example 1 and Comparative example 2, and the first to third layers were formed for Example 2 on the whole surface of the insulating substrate 11, respectively so that the respective layers were formed into a pattern of 30 μm×3500 μm in dimension. Then, each pattern was thoroughly covered with a cap layer made of molybdenum (Mo). A counter electrode having a stacked structure of an aluminum (Al) layer and a titanium (Ti) layer was formed on the respective patterns, with an insulating film having a stacked structure of a SiN layer (300 nm thick) and a $SiO_2$ layer (300 nm thick) in between.

Voltage was applied across the patterns obtained in Examples 1 and 2 and Comparative example 2, respectively, and the counter electrode. If one of the patterns passed a current of 10 to 7 A or more, it was regarded as failure. Cumulative failure rate was thus computed. The results are shown in FIG. 19.

Figure 19:
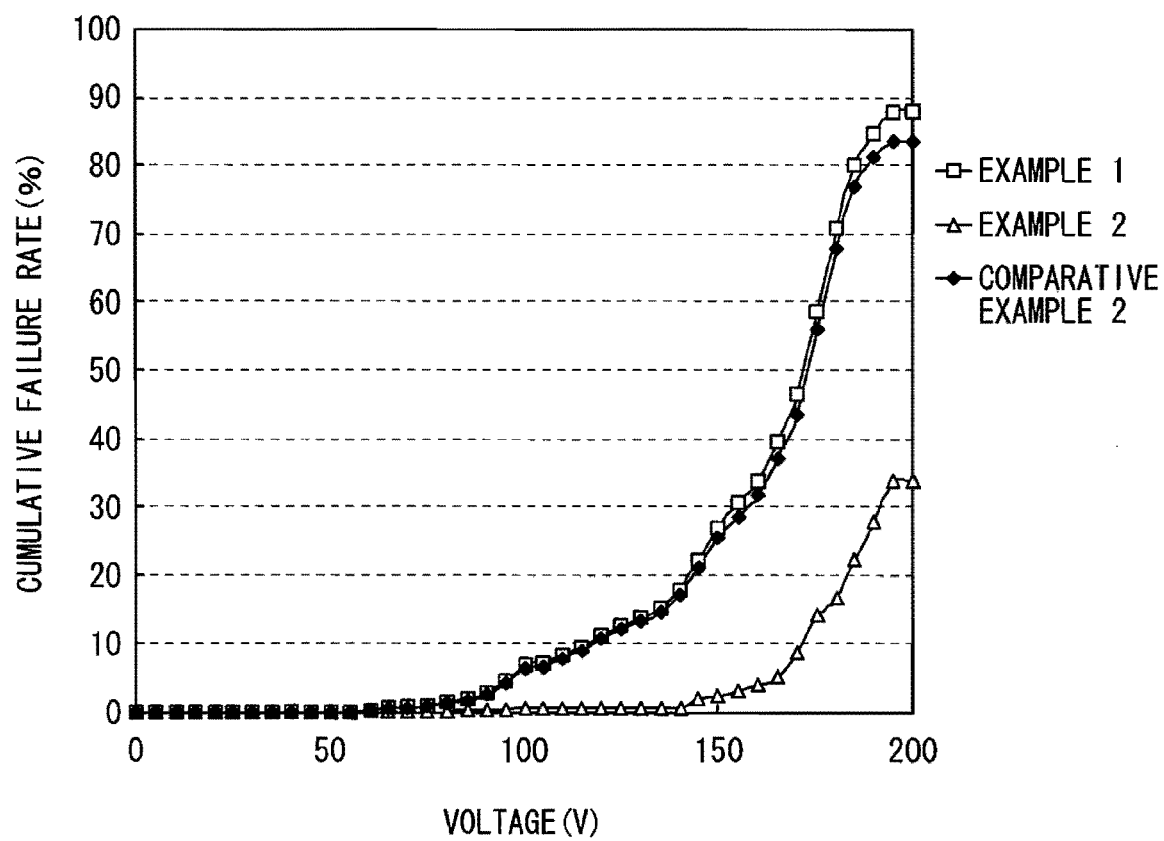
FIG. 19 is a graph showing a cumulative failure rate computed for each of the examples.

As shown in FIG. 19, a remarkable reduction of failure rate was observed in the case of Example 2 in which the crossing portion 160 was a three-layer structure including the third layer 163 added between the insulating substrate 11 and the first layer 161. Namely, it was found out that pressure resistance was able to improve more by providing the third layer 163 made of a material having a higher melting point than the first layer 161 between the insulating substrate 11 and the first layer 161.

As mentioned above, although the present invention has been described with reference to the foregoing embodiments and examples, the present invention is not limited to those but may be variously modified. For example, in the above-mentioned embodiments and examples, although description is made for the case where the source signal line Y1 is divided for each pixel, it is also possible to design the pixel configuration in such a manner that neighboring pixels are line-symmetrical to each other and have a common crystallization area two by two so that irradiation of the laser beam LB for crystallization may be conducted simultaneously for each pair of the neighboring line-symmetrical pixels two by two. Even in this case, effects similar to the first and second embodiments may be obtained when the crossing portion 160 is disposed outside the irradiation area R of the laser beam LB.

Alternatively, in the above-mentioned embodiments and examples, although description is made for the case where only the crossing portion 160 of the source signal line Y1 has a two-layer structure including the first and second layers 161 and 162, or a three-layer structure including the first to third layers 161 to 163 for example, it is also possible to make both of the crossing portion 160 and the main portion 170 have the two-layer structure or the three-layer structure.

Further, in the above-mentioned embodiments and examples, although description is made for the case where the source signal line Y1 is divided into the crossing portion 160 and the main portion 170 for example, it is also possible to divide the gate wiring X1 and the current supply line Y2.

In addition, for example, the component material and thickness of each layer, or the method and condition for forming layers and so on are not limited to those explained in the above-mentioned embodiments and examples but other materials, thickness, methods and conditions may be employed.

Although specific example is given to explain the configuration of the organic light emitting elements 10R, 10B and 10G in the above-mentioned embodiments, it is not necessary to prepare the all layers, or another layer may be further added.

The present invention is also applicable to a display unit which employs other display elements, such as an inorganic electroluminescent element, electrodeposition/electrochromic display element and so on besides the organic light emitting element and liquid crystal display element.

Obviously many modifications and variations of the present invention are possible in the light of the above teachings. It is therefore to be understood that within the scope of the appended claims the invention may be practiced otherwise than as specifically described.

What is claimed is:

1. A display unit comprising:
an insulating substrate;
a plurality of wirings formed to extend in different directions on the insulating substrate;
a thin-film transistor; and
a display element,
wherein,
at least one of the plurality of wirings is a divided wiring having a crossing portion formed at an intersection with the other of the plurality of wirings, and a main portion which is formed in a layer same as the other of the plurality of wirings with an insulating film in between and which is electrically connected to the crossing portion via an conductive connection provided in the insulating film,
at least one of the main portion and the crossing portion includes a first layer and a second layer stacked in order from the insulating substrate side, the second layer being in direct contact with the first layer and made of a material of a higher melting point than the first layer, and
the first layer and the second layer are formed continuously on the insulating substrate.

2. The display unit according to claim 1, wherein
the first layer is made of a metal or an alloy containing at least one selected from the group consisting of aluminum (Al), copper (Cu) and silver (Ag), and
the second layer is made of a metal or an alloy containing at least one selected from the group consisting of molybdenum (Mo), chromium (Cr), titanium (Ti), tungsten (W), tantalum (Ta), vanadium (V), niobium (Nb), nickel (Ni) and magnesium (Mg).

3. The display unit according to claim 1, wherein at least one of the main portion and the crossing portion includes a third layer which is made of a material of a higher melting point than the first layer and is disposed between the insulating substrate and the first layer.

4. The display unit according to claim 3, wherein the third layer is made of a metal or an alloy containing at least one selected from the group consisting of molybdenum (Mo), chromium (Cr), titanium (Ti), tungsten (W), tantalum (Ta), vanadium (V), niobium (Nb), nickel (Ni), and magnesium (Mg).

5. The display unit according to claim 1, wherein an upper surface and a side face of the crossing portion are covered with a cap layer made of a material of a higher melting point than the first layer.

6. The display unit according to claim 1, wherein the plurality of wirings include a source signal line and a gate wiring, the source signal line being the divided wiring.

7. The display unit according to claim 6, wherein
the thin film transistor is formed by annealing a semiconductor film with an irradiation of laser beam, and the crossing portion of the source signal line is formed so as to be located outside an irradiation area of the laser beam.

8. A method of manufacturing a display unit which is constituted from steps of forming, on an insulating substrate, a plurality of wirings including a source signal line and a gate wiring, a thin film transistor and a display element,
wherein the step of forming the plurality of wiring comprising the steps of:
forming a crossing portion of the source signal line at an intersection with the gate wiring;
forming an insulating film on the insulating substrate on which the crossing portion is formed; and
forming a main portion of the source signal line and the gate wiring on the insulating film and providing a conductive connection in the insulating film for electrically connecting the main portion and the crossing portion, and
in the step of forming the crossing portion of the source signal line, a first layer and a second layer made of a material of a higher melting point than the first layer are continuously formed in order from the insulating substrate side.

9. The method of manufacturing the display unit according to claim 8, wherein
the first layer is made of a metal or an alloy containing at least one selected from the group consisting of aluminum (Al), copper (Cu) and silver (Ag), and
the second layer is made of a metal or an alloy containing at least one selected from the group consisting of molybdenum (Mo), chromium (Cr), titanium (Ti), tungsten (W), tantalum (Ta), vanadium (V), niobium (Nb), nickel (Ni), and magnesium (Mg).

10. The method of manufacturing the display unit according to claim 8, wherein, in the step of forming the crossing portion of the source signal line, a third layer made of a material of a higher a melting point than the first layer, the first layer and the second layer are continuously formed in order from the insulating substrate side.

11. The method of manufacturing the display unit according to claim 10, wherein the third layer is made of a metal or an alloy containing at least one selected from the group consisting of molybdenum (Mo), chromium (Cr), titanium (Ti), tungsten (W), tantalum (Ta), vanadium (V), niobium (Nb), nickel (Ni) and magnesium (Mg).

12. The method of manufacturing the display unit according to claim 8, wherein an upper surface and a side face of the crossing portion are covered with a cap layer made of a material of a higher melting point than the first layer.

13. The method of manufacturing the display unit according to claim 12, wherein a gate electrode of the thin film transistor is formed with the same material as the cap layer, simultaneously with the formation of the cap layer.

14. The method of manufacturing the display unit according to claim 8, wherein
the step of forming the thin film transistor includes a step of annealing a semiconductor film with an irradiation of laser beam, and
the crossing portion of the source signal line is formed to be located outside an irradiation area of the laser beam.

* * * * *